United States Patent
Nagy

[11] Patent Number: 5,696,665
[45] Date of Patent: Dec. 9, 1997

[54] INTEGRATED CIRCUIT PACKAGE WITH DIAMOND HEAT SINK

[75] Inventor: Bela G. Nagy, Acton, Mass.

[73] Assignee: Saint-Gobain/Norton Industrial Ceramics Corporation, Worcester, Mass.

[21] Appl. No.: 636,180

[22] Filed: Apr. 22, 1996

Related U.S. Application Data

[63] Continuation-in-part of Ser. No. 269,706, Jul. 1, 1994.
[51] Int. Cl.⁶ .................................. H05K 7/20
[52] U.S. Cl. ...................... 361/723; 165/80.3; 165/185; 174/16.3; 257/707; 257/713; 257/675; 361/704; 361/707; 361/718
[58] Field of Search .................... 165/80.1, 80.2, 165/80.3, 185, 104.33; 174/16.3; 257/705–707, 712, 713, 668, 675; 361/704–709, 713, 717–718, 723, 813; 437/209, 215, 221, 224, 901

[56] References Cited

U.S. PATENT DOCUMENTS

| | | | |
|---|---|---|---|
| 4,764,804 | 8/1988 | Sahara et al. | 174/16.3 |
| 5,008,737 | 4/1991 | Burnham et al. | 257/712 |
| 5,146,314 | 9/1992 | Pankove | 165/104.33 |
| 5,379,187 | 1/1995 | Lee et al. | 361/813 |

FOREIGN PATENT DOCUMENTS

| | | |
|---|---|---|
| 0273556 | 7/1988 | European Pat. Off. . |
| 515094 | 11/1992 | European Pat. Off. . |
| 0538798 | 4/1993 | European Pat. Off. . |
| 3227535 | 8/1991 | Japan . |
| 3227535 | 10/1991 | Japan . |
| 5160304 | 6/1993 | Japan . |
| 5251609 | 9/1993 | Japan . |
| 6291217 | 10/1994 | Japan . |

OTHER PUBLICATIONS

Electrical Resistive, Thermally conductive Diamond Coating for Integrated Circuit Chips "Research Disclosure", Apr. 1988, No. 288.

*Primary Examiner*—Gregory D. Thompson
*Attorney, Agent, or Firm*—Volker R. Ulbrich

[57] ABSTRACT

An IC package includes a high thermal conductivity insulating material substrate, such as polycrystalline diamond or diamond-coated silicon carbide or molybdenum, on which the IC is mounted for thermal management. The electrical lead pins of the package are electrically connected to the IC and thermally connected to the substrate. The thermal connection can be by bonding the pins directly to the substrate.

4 Claims, 3 Drawing Sheets

INTEGRATED CIRCUIT PACKAGE WITH DIAMOND HEAT SINK

CROSS-REFERENCE TO RELATED APPLICATIONS

This is a continuation-in-part of application Ser. No. 08/269,706 filed Jul. 1, 1994.

BACKGROUND OF THE INVENTION

The ever-increasing demand for smaller size and higher performance information systems has led to the development of the integrated circuit ("IC") as the information processing center of the modern computer. These IC devices, also referred to as IC dies, are typically housed within standard ceramic, plastic or metal packages adapted for housing and connecting the IC die to circuit boards for carrying information between the IC die and other information processing units within an electronic system.

In one type of plastic encapsulated dual in-line package, such as the package 1 shown in FIG. 1, an integrated circuit IC die 2 having a plurality of wire bonding pads 3 at its perimeter is fastened to a thermal management IC die pad, or substrate 4 which is held by two tie bars 5. The entire assembly is embedded in thermoplastic molding compound encapsulant 6, such as a polyamide, with a plurality of metal electrical lead pins 7 also being embedded partially in the plastic encapsulant 6. The inner ends of the pins 7 are provided with wire bonding pads 8, such as nickel plated areas. The pins 7 and substrate 4 are parts which have been separated from a lead frame in the course of assembly of the package 1. Electrical lead bonding wires 9 are bonded to the IC pads 3 of the IC die and the bonding pads 8 of the pins 7 to connect the IC die 2 to the pins 7. The pins 7 provide a rugged housing and electrical connection means for connecting the delicate IC die 2 to other circuit components.

Because electrical inefficiencies in the IC die 2 generate heat, the temperature of both the IC die 2 and other parts of the package supporting the IC die 2 significantly rise during use. It is known that such elevated temperatures can severely degrade the IC's performance. For example, because many of the IC system's critical processes rely on electron kinetics phenomena which become accelerated by increased temperature, failures in metallization and bonded interfaces of the IC can occur during extended use. Accordingly, heat production by the IC die, often termed "thermal density", has become a significant design consideration which threatens to limit the further miniaturization of information systems within reasonable cost constraints.

Conventional treatment of the thermal density problem has met with limited success. For example, in the prior art design shown in FIG. 1, heat generated by the IC die is dissipated through the plastic encapsulant, the IC die pad 4, and the bonding wires 9 electrically connecting the IC die 2 to the pins 7 of the lead frame. However, each of these thermal conduits is only marginally effective. In particular, the bonding wires 9 wires are poor thermal conduits because they have a diameter of only about 0.002 inch (50 microns [micrometers]). The tie bars 5, which are about 0.010 inch (250 microns) thick have a much larger cross-section, but are ineffective thermal conduits because they are truncated at each end of the IC package, leaving no metal thermal paths available to the outside after the IC encapsulation process. The plastic encapsulant 6 itself has a very low thermal conductivity.

One present improvement in thermal dissipation involves covering the thermal substrate 4 with a more thermally conductive, large surface area material known functionally as a "heat spreader." Although embedded heat spreaders succeed in dissipating hot spots on the IC die, they do not significantly assist in total heat removal from the IC.

Another present improvement involves blowing air across either the package to thereby remove more heat from it by convection. Although this improvement succeeds in removing more heat from the package, it adds cost and generally requires geometry changes in the area around the package. It may also not be sufficient for some transient circuit conditions in which there is rapid internal heat buildup in the package over a short period of time because of inadequate heat removal response of the package.

Therefore, it is an object of the present invention to provide an IC package which retains the external configuration of existing packages while also improving the heat removal response and total heat removal from the IC.

SUMMARY OF THE INVENTION

The novel IC package in accordance with the present invention has electrical lead pins held in place by an encapsulant around an IC which is attached to a coated metallic or non-metallic thermal management substrate. The substrate is highly insulating electrically and highly conductive thermally. The pins are electrically connected to the IC and thermally coupled to the substrate, so that the substrate conducts heat to the outside through both the encapsulant and through the pins. The added conduction of heat from the substrate by the pins substantially increases the ability of the package to maintain the IC at a low operating temperature.

DETAILED DESCRIPTION OF THE INVENTION

Figure 1:
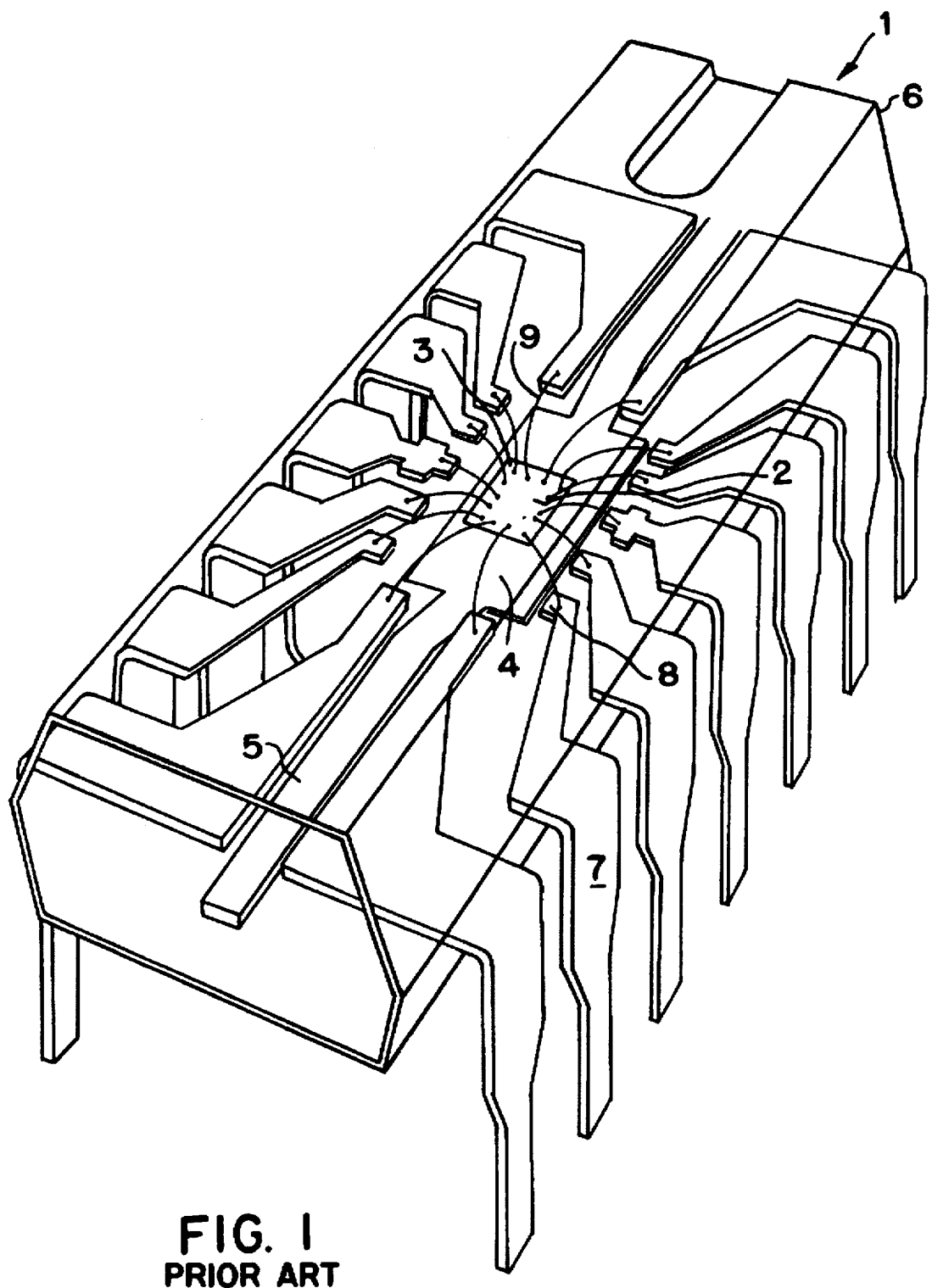
FIG. 1 is an elevated perspective view of a prior art dual in-line integrated circuit package (DIP).

It has been found that by mounting a conventional IC die on an electrically insulating and thermally conductive substrate, such as polycrystalline diamond manufactured by CVD (chemcial vapor deposition), and providing intimate thermal contact of the substrate with the electrical lead pins, each of the lead pins becomes an effective direct conduit for thermal dissipation from the substrate. Because the electrical lead pins have thicknesses of about 0.010 inches (250 microns), they possess a much greater cross-section than the bonding wires which electrically connect the pins to the IC die and are more thermally conductive than the plastic encapsulant. As a result, the present invention provides for improved heat removal response and increased heat removal rate from the IC.

For the purposes of the present invention, "intimate thermal contact" between two members means that the thermal conductivity of an interface connecting one member, such as a substrate, to another member, such as an electrical lead pin or an IC die, exceeds 1.5 W/(cm K), so that there is essentially no thermal resistance provided by any gap therebetween. The substrate is in intimate thermal contact with both the electrical lead pins and the IC die.

Any substrate having a thermal conductivity of at least about 2 W/(cm K) and an electrical resisitivity of at least about $10^6$ ohm-cm at 10 volts d.c. can be used as the electrically insulating and thermally conductive substrate of the present invention. Such substrates include, but are not limited to, diamond, aluminum nitride, beryllia, diamond-coated substrates, metal composites, and insulator-clad metals. Preferably, the thermal conductivity of the substrate is at least about 4 W/(cm K) and is preferably at least about 10 W/(cm K). Preferably, the electrical resisitivity of the base is at least about $10^8$ ohm-cm and preferably exceeds $10^{10}$ ohm-cm. The thickness of the base may be between about 50 and about 500 um, and is preferably between about 50 and 200 um.

The substrate is preferably diamond because it is both an excellent electrical insulator as well as an excellent thermal conductor. Such diamond can be any high thermal conductivity diamond, whether free-standing or in the form of a coating on some other base material. Polycrystalline diamond made by chemical vapor deposition (CVD) is particularly suitable because it can be made in pieces with a larger flat surface area than is available from natural diamonds or synthetic diamond made by high pressure and high temperature methods. In some embodiments, the substrate may be a diamond having a thermal conductivity of at least about 4 y W/(cm K) and an electrical resisitivity of at least about $10^{10}$ ohm-cm. Typically, the diamond is chemically vapor deposited (CVD) diamond which has a thickness of between about 150 and about 200 microns. Because the diamond can be so thin, its utilization in the present invention offers a design advantage in that it can be incorporated into conventional IC package designs without a significant change in the existing package geometry, thereby limiting any package redesign as well as any redesign of systems in which such packages are installed.

Figure 2:
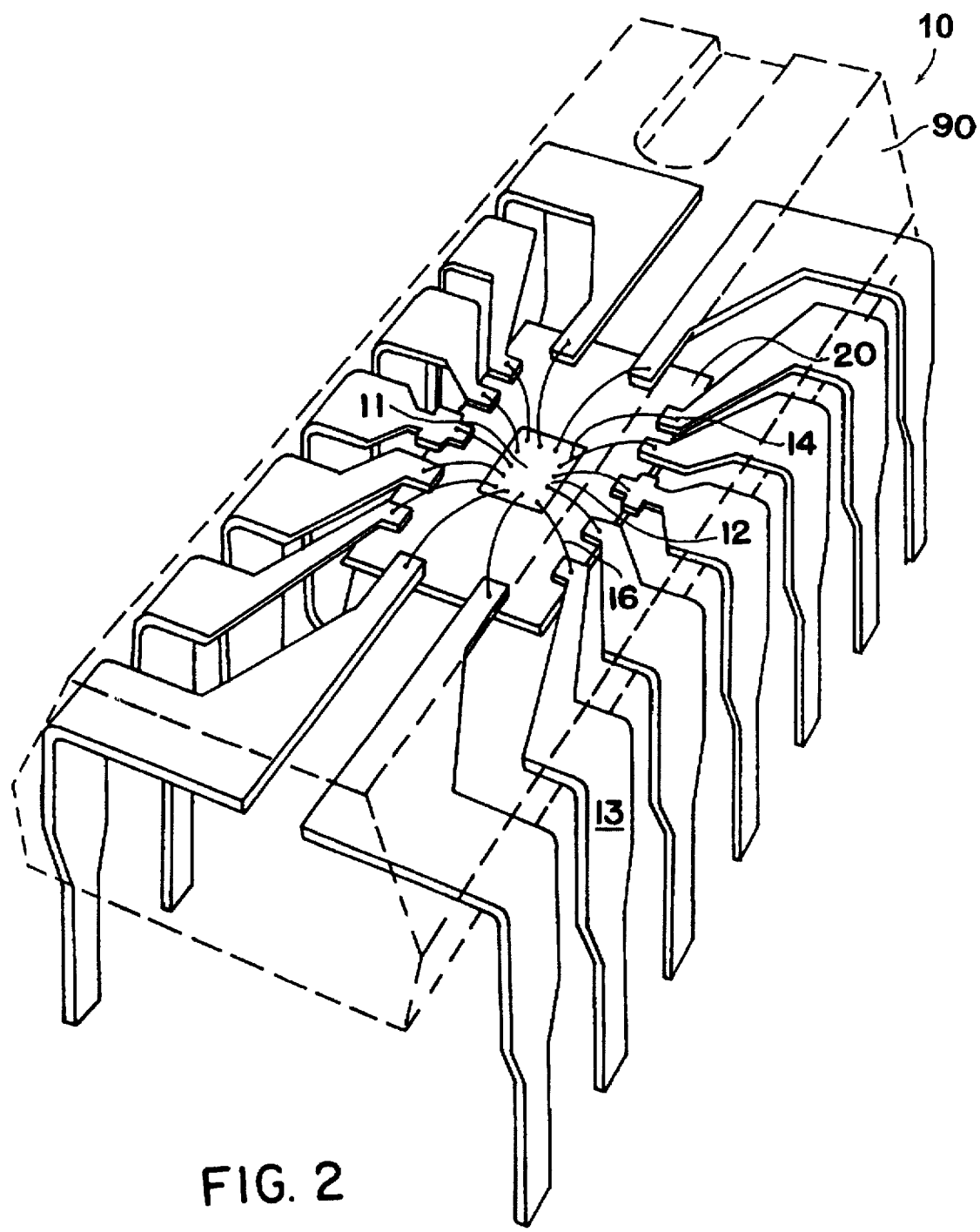
FIG. 2 is an elevated perspective view of a dual in-line integrated circuit package in accordance with one embodiment of the present invention in which metal pins are bonded directly to a substrate.

In one embodiment of the present invention, as shown in FIG. 2, there is provided a plastic encapsulated IC die package 10 comprising an IC die 11 having bonding pads 12 and which is mounted upon a diamond substrate 20. Electrical lead pins 13 having pin connection bonding pads 14 are not only electrically connected with the IC die 11 via gold electrical bonding wires 16, but are also placed in intimate thermal contact with the diamond substrate 20 by being soldered thereto or bonded under some compression with fast-setting high thermal conductivity epoxy resin. The entire assembly of IC die 11, substrate 20, and pins 13 is encapsulated with a plastic encapsulant compound 90, leaving bare an end portion of each pin for electrical connection to a circuit board. Because diamond is an excellent thermal conductor, heat generated within the IC die 11 flows through the diamond substrate 20 into each of the pins 13 and subsequently out of the package 10. In contrast to the prior art design shown in FIG. 1, wherein heat generated by the IC die is dissipated directly through only thin electrical connection gold bonding wires and through the plastic encapsulant, the present invention allows heat from the substrate to be dissipated not only through the thin electrical connection bonding wires and plastic encapsulant, but also directly through each of the wide pins 13. Because a package in accordance with the present invention presents more avenues for heat dissipation than does the conventional design, it significantly improves heat removal from the IC die. Thermal analysis of the pins and encapsulant reveals that copper pins of a typical prior art package design have a thermal conductivity of about 388 W/(m K) while the plastic encapsulant has a thermal conductivity of only about 1 W/(m K). Since the thermal conductivity of the pins is several hundred times that of the encapsulant, it is contemplated that the advantage of the present invention increases essentially directly with the number of pins in the package.

In one embodiment of the present invention containing 24 pins, finite element analysis revealed that the $T_{ja}$ (i.e., the temperature differential between the device junction and the ambient temperature) was only about 60 degrees C. (Celsius). In contrast, the $T_{ja}$ for a comparable conventional IC package was about 400 degrees C. for the same power input.

The method by which the diamond is attached to the IC die can be any conventional attachment means, including soldering, clamping, bonding agents, and silver loaded epoxies. Similarly, the method by which the diamond is attached to the pins of the package can be any conventional attachment means, including clamping, soldering, bonding agents, silver-loaded epoxies, wire bonding, and brazing.

Any conventional IC die and electrical lead frame design can be used with the present invention as long as the design allows for a diamond to be in intimate thermal contact with both the IC die and the pins of the electrical lead frame. Conventional IC dies include integrated circuits and discrete active devices, such as transistors and diodes. Conventional package designs specified by JEDEC (Joint Electronic Devices Engineering Conference) include both plastic and ceramic DIP (Dual In-Line Package), SIP (Single In-Line Package), PGA (Plastic Ball-Grid Array), QFP (Quad Flat Pack), BGA and LCC designs. When an electrically insulating and thermally conducting substrate other than diamond is used, the IC package of the present invention is also similarly encapsulated.

Because the electrically insulating and thermally conductive substrate of the present invention provides for greater heat removal from the IC die, an IC package according to the present invention can tolerate larger amounts of power than a package in accordance with prior art designs without exceeding the critical device junction temperature. In particular, the present invention provides an improved package capable of dissipating up to at least about 600% more power than the standard non-thermally enhanced counterpart in forced air with a convection coefficient of about 50 W/$m^2$ degrees C. at 50 degrees C. while still maintaining a maximum junction temperature of 125 degrees C. In one embodiment, finite element analysis revealed that a 24 pin DIP of the present invention was capable of dissipating about 12 watts of power in forced air with a convection coefficient of about 50 W/($m^2$ degrees C.) at 50 degrees C. while still maintaining a maximum junction temperature of 125 degrees C. In contrast, the standard 24 pin DIP could dissipate only 1.6 watts.

Figure 3:
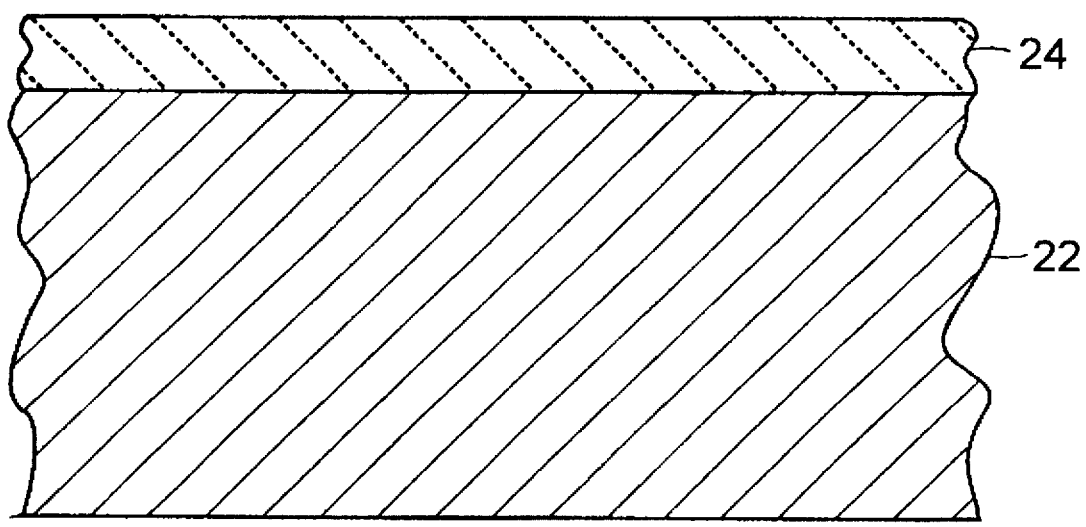
FIG. 3 is a sectional view of a fragment of an alternate substrate for the package of FIG. 3.

An alternative and particularly useful form of thermally-conductive substrate for use in accordance with the present invention is a silicon carbide wafer 22 shown in FIG. 3 which has a coating 24 of diamond film on its surface to which the lead frame is attached. In other respects the substrate is used just as if it were entirely of diamond film, but it is of lower cost because a substantial portion of its bulk is silicon carbide instead of diamond. Typically, the silicon carbide would be from about 0.5 mm to about about 5.0 mm thick and the diamond coating on its surface would be at least about 5 micrometers thick, or just thick enough to provide the requisite electrical characteristics and thicker to the extent that any heat spreading function is desired. The silicon carbide is relatively inexpensive. It has a very close match of the coefficient of thermal expansion to that of the diamond, which prevents warping of the substrate with temperature changes. It also is a good thermal conductor. It can be readily finished to provide dimensional control of the thickness. Finally, its electrical characteristics are suitable for such an application. Similar structures with other base materials, such as molybdenum, may be coated with diamond and used in like fashion.

I claim:

1. An integrated circuit package comprising:

(a) an integrated circuit, (b) a lead frame having a plurality of legs in electrical connnection with the integrated circuit, and (c) an electrically insulating, thermally conductive substrate having first and second faces, the first face being coated with diamond film which is in intimate thermal contact with both the integrated circuit and the plurality of legs of the lead frame, the bulk of the substrate comprising a thermally-conductive non-diamond material.

2. The package of claim 1 wherein the non-diamond material is chosen from the group consisting of molybdenum, aluminum nitride, graphite, and silicon carbide.

3. The package of claim 2 wherein the diamond film has a thickness of at least 5 micrometers.

4. The package of claim 1 wherein the non-diamond material is about 500 microns thick.

* * * * *